United States Patent
Sodickson et al.

(10) Patent No.: US 8,026,721 B2
(45) Date of Patent: Sep. 27, 2011

(54) REMOTE BODY ARRAYS FOR HIGH-PERFORMANCE MAGNETIC RESONANCE IMAGING AND SPECTROSCOPY

(75) Inventors: Daniel Sodickson, Larchmont, NY (US); Stephan Biber, Erlangen (DE); Markus Vester, Nuremberg (DE); Wolfgang Renz, Erlangen (DE); Wilfried Schnell, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 277 days.

(21) Appl. No.: 12/392,537

(22) Filed: Feb. 25, 2009

(65) Prior Publication Data

US 2010/0213939 A1     Aug. 26, 2010

(51) Int. Cl.
*G01V 3/00* (2006.01)

(52) U.S. Cl. ......................................... 324/318; 324/309

(58) Field of Classification Search .......... 324/300–322; 600/407–445
See application file for complete search history.

(56) References Cited

U.S. PATENT DOCUMENTS

| 7,071,693 | B2 * | 7/2006 | Yasuhara | 324/319 |
|---|---|---|---|---|
| 7,327,142 | B2 * | 2/2008 | Robb et al. | 324/318 |
| 7,701,216 | B2 * | 4/2010 | Du et al. | 324/318 |
| 2008/0211495 | A1 | 9/2008 | Steckner | |
| 2009/0206840 | A1 | 8/2009 | Overweg et al. | |
| 2010/0231215 | A1 * | 9/2010 | Ma et al. | 324/307 |

OTHER PUBLICATIONS

"An Introduction to Coil Array Design for Parallel MRI," Ohliger, et al., NMR Biomed., vol. 19 (2006) pp. 300-315.

* cited by examiner

*Primary Examiner* — Brij Shrivastav
(74) *Attorney, Agent, or Firm* — Schiff Hardin LLP

(57) ABSTRACT

In a magnetic resonance imaging apparatus and method, radio frequency signals are radiated into an examination subject and/or received from the examination subject by an array of radio frequency coils that completely encircles the examination subject, and that is located at a distance from the examination subject out of contact with the examination subject.

21 Claims, 7 Drawing Sheets

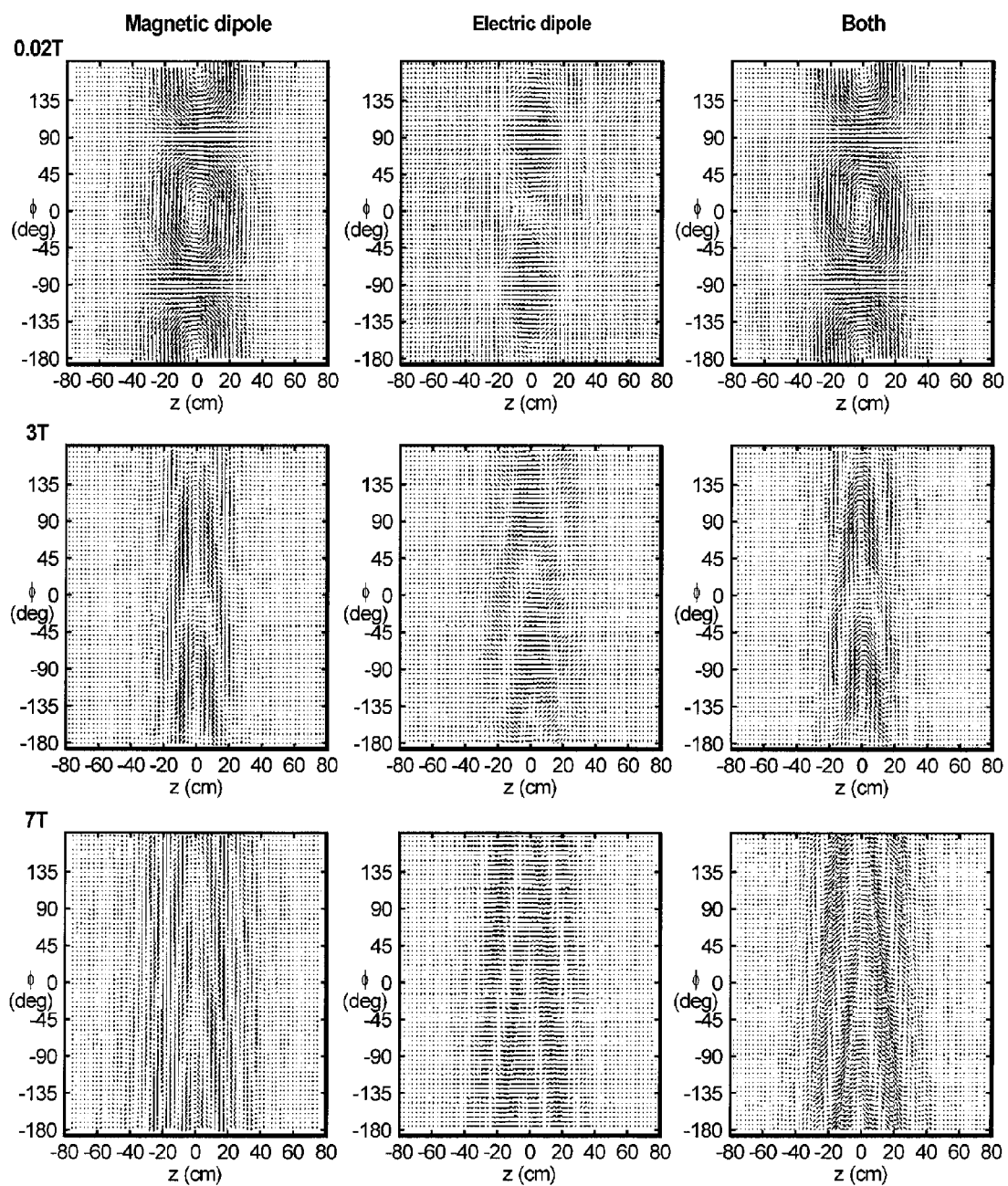

REMOTE BODY ARRAYS FOR HIGH-PERFORMANCE MAGNETIC RESONANCE IMAGING AND SPECTROSCOPY

BACKGROUND OF THE INVENTION

1. Field of the Invention

The present invention relates to the use and configuration of radio frequency transmitting and/or receiving coils in magnetic resonance imaging.

2. Description of the Prior Art

The body coil incorporated into the bore of most modern MR scanners is typically a birdcage design operated as a single quadrature element. At low to moderate magnetic field strengths, this design allows more or less homogeneous excitation and reception. Increased SNR in reception may be achieved through the use of radiofrequency (RF) coil arrays (Roemer P B, Edelstein W A, Hayes C E, Souza S P, Mueller O M. The NMR phased array. Magn Reson Med 1990; 16(2): 192-225).

Over the past decade, the use of radiofrequency coil arrays in MRI has increased dramatically. Benefits of many-element arrays include both SNR improvements (Roemer P B, Edelstein W A, Hayes C E, Souza S P, Mueller O M. The NMR phased array. Magn Reson Med 1990; 16(2): 192-225) and parallel imaging capability (Sodickson D K, Manning W J. Simultaneous acquisition of spatial harmonics (SMASH): fast imaging with radiofrequency coil arrays. Magn Reson Med 1997; 38(4): 591-603; Pruessmann K P, Weiger M, Scheidegger M B, Boesiger P. SENSE: Sensitivity encoding for fast MRI. Magn Reson Med 1999; 42(5): 952-962; Griswold M A, Jakob P M, Heidemann R M, Nittka M, Jellus V, Wang J, Kiefer B, Haase A. Generalized autocalibrating partially parallel acquisitions (GRAPPA). Magn Reson Med 2002; 47(6): 1202-10.). Since the advent of parallel imaging, which uses RF coil arrays to acquire multiple components of image data simultaneously rather than in a traditional sequential order (thereby accelerating image acquisition beyond previous limits), there has been a steady progression towards ever larger numbers of array elements, with ever denser arrangements. 32-channel MR systems compatible with 32-element arrays are now common, and experimental systems with 128 receiver channels have recently been developed, allowing exploration of 128-element arrays (Schmitt M, Potthast A, Sosnovik D E, Wiggins G, Triantafyllou C, Wald L. A 128 Channel Receive-Only Cardiac Coil for 3T. Fifteenth Scientific Meeting of the International Society for Magnetic Resonance in Medicine. Berlin, Germany, 2007: 245; Hardy C, Giaquinto R O, J. E. P, et al. 128-Channel Body MRI with a Flexible High-Density Receiver-Coil Array. Proceedings 15th Scientific. Meeting, International Society for Magnetic Resonance in Medicine, 2007: 244; Lee R F, Chang H, Stefanescu C, et al. A 128-channel Helium-3 Phased Array at 3T for Highly Accelerated Parallel Imaging in Hyperpolarized Gas MRI. Proceedings 16th Scientific Meeting, International Society for Magnetic Resonance in Medicine. Toronto, 2008.). Such large arrays are associated with various practical challenges, including increased bulk, cost, and complexity as compared with few-element designs. Patient-specific placement of heavy many-element arrays with dense cabling can be cumbersome, and the ability to accommodate multiple body types can be sacrificed. The use of multiple many-element arrays targeted to different body habitus or body region could also add significant expense to MR systems. Nevertheless, the benefits of many-element arrays for imaging speed, SNR, volumetric coverage, and, more recently, control of signal homogeneity and RF energy deposition (via parallel transmission (Katscher U, Bornert P, Leussler C, van den Brink JS. Transmit SENSE. Magn Reson Med 2003; 49(1): 144-50; Zhu Y. Parallel excitation with an array of transmit coils. Magn Reson Med 2004; 51(4): 775-84; Setsompop K, Wald L L, Alagappan V, Gagoski B, Hebrank F, Fontius U, Schmitt F, Adalsteinsson E. Parallel RF transmission with eight channels at 3 Tesla. Magn Reson Med 2006; 56(5): 1163-71.)) continue to drive research on and clinical use of many-element arrays.

Conventional wisdom and RF engineering rules of thumb have held that coil array elements must be placed as close as possible to the body surface in order to achieve optimal SNR performance. In select cases, loose-fitting encircling volume arrays are used, e.g. for brain imaging, where multiple head sizes must be accommodated, but it is generally assumed that SNR decreases as array radius increases and "filling factor" decreases. Many-element arrays designed for imaging of large body regions have generally been split into top and bottom halves, with each half designed to contour closely to the body surface in order to maximize SNR. Flexible many-element designs present challenges for accurate coil sensitivity calibration, since coil deformation can perturb dramatically the sensitivity of small elements. Rigid contoured designs, on the other hand, tend to accommodate only a small range of possible body types (and split designs may still suffer from some degree of motion-related sensitivity shifts). All surrounding many-element designs, furthermore, tend to fill large quantities of valuable space within the scanner bore, thereby limiting the size of subjects who may be scanned.

The SNR benefits of close-fitting coils have been assumed to be particularly applicable for parallel imaging, which relies on distinctness of coil sensitivity profiles for spatial encoding. It is known that a coil's sensitivity is generally attenuated and broadened with increasing distance from the coil, and broad sensitivities are known to result in significant noise amplification in parallel imaging. Given expectations that baseline SNR would drop and that parallel imaging capability would be reduced for coil arrays at a substantial distance from the body, there has been little impetus for exploring remote body arrays lining or incorporated into the scanner bore, and no such arrays have been incorporated into commercial products or reported in the literature.

However, detailed examination of the underlying electrodynamics indicates that remote body arrays with appropriate encircling designs actually have unexpected benefits. In particular, simulations of sample remote body array configurations suggest that, for deep tissue regions, signal-to-noise ratio (SNR) may generally be preserved, or in select situations even slightly increased, as compared with body-lining surface arrays, even in the presence of parallel imaging. New designs with further improved SNR are also possible if appropriate current paths are included in remote body arrays.

SUMMARY OF THE INVENTION

An object of the present invention is to make use of large encircling integrated arrays to gain the benefits of SNR and parallelism described above while eliminating the ergonomic and other practical challenges associated with many-element surface coil arrays.

The above object is achieved in accordance with the invention by replacing or augmenting the functions of a traditional body coil and separately configured receive arrays in MR scanners with an integrated many-element array at a distance from the body (e.g. lining or incorporated into the scanner bore). This enables broad functionality, including volumetric imaging with high signal-to-noise ratio (SNR) and highly parallel transmission and reception, all with a dramatically improved workflow. For routine examinations using such a system, no custom coils need to be placed on a patient, no coils or cables are visible to patient or operator, and coil array calibrations are facilitated by the fixed position of array elements. At the same time, the functionality of conventional body coils and surface coil arrays is preserved using appropriate combinations of elements of the remote body array.

BRIEF DESCRIPTION OF THE DRAWINGS

FIG. 7 illustrates current distributions in a 30 cm surface which result in ultimate intrinsic central SNR for various magnetic field strengths and current contributions.

DESCRIPTION OF THE PREFERRED EMBODIMENTS in order to explore the behavior of SNR as a function of distance from the body, numerical simulations were performed, using the general methodology described in (Schnell W, Renz W, Vester M, Ermert H. Ultimate Signal-to-Noise Ratio of Surface and Body Antennas for Magnetic Resonance Imaging. IEEE Transactions on Antennas and Propagation 2000; 48(3): 418-428) updated as outlined in (Sodickson D K, et. al. Approaching the Ultimate Intrinsic Signal-to-Noise Ratio in a Cylindrical Geometry; Electrodynamics of Large Encircling Radiofrequency Coil Arrays. 2008; in preparation). FIG. 1A shows the geometry of the simulations, in which a dielectric cylinder (body liner) of 20 cm radius with uniform electrical permittivity and conductivity (approximating the average frequency-dependent properties of muscle tissue in this case) is surrounded by a cylindrical surface of equal or greater radius on which currents are allowed to flow. FIG. 1B shows the same geometry for an array with a radius of 30 cm (bore liner). Free space electrical properties are used for the space between the two cylindrical surfaces. A mode expansion of all possible current patterns on the surface of the outer cylinder was performed, and each current mode was matched, using dyadic Green's functions with appropriate boundary conditions, to a corresponding electric and magnetic field distribution. In order to model the ultimate intrinsic SNR (corresponding to the highest SNR compatible with electrodynamics, independent of particular array design), each current mode was treated as an independent "coil" in an SNR-optimizing parallel image reconstruction. It has been shown (Ohliger M A, Grant A K, Sodickson D K. Ultimate intrinsic signal-to-noise ratio for parallel MRI; Electromagnetic field considerations. Magn Reson Med 2003; 50(5): 1018-30; Wiesinger F, Boesiger P, Pruessmann K P. Electrodynamics and ultimate SNR in parallel MR imaging. Magn Reson Med 2004; 52(2): 376-90) that such an approach defines the upper limit of allowable SNR. The case of particular discrete RF coil array designs represents a special case of the general mode expansion, in which particular weighted combinations of modes are formed to approximate the defined coil current patterns. For the computations described herein, weights were derived to approximate cylindrical window coils—i.e. rectangular loops contoured to the cylindrical surface. As illustrated in FIGS. 1A and 1B, window coils were arranged to tile the surface of the outer cylinder with 10% overlap in both circumferential and axial directions, and with alternate rings staggered to minimize overlap of coil corners. The effective conductor width for window coils was established by the maximum mode order used, and the thickness was set to the frequency-dependent skin depth. Sensitivity patterns and noise correlation matrices for arrays with various numbers of elements were derived from the mode field distributions, and SNR was computed using SNR-optimizing SENSE reconstructions (Pruessmann K P, Weiger M, Scheidegger MB, Boesiger P. SENSE: Sensitivity encoding for fast MRI. Magn Reson Med 1999; 42(5): 952-962). In order to model the effects of the RF shield on arrays approaching the surface of the magnet bore, a conductive cylinder was placed at 34.5 cm radius, and boundary conditions were modified accordingly. Noise was modeled in several components: a) body-derived noise, computed from the volume integral of electric fields against the conductivity distribution, b) coil-derived noise, computed using the conductivity of copper for the derived current distributions, c) shield-derived noise, determined from currents induced in the shield, also assumed to have copper conductivity, and d) preamplifier and receiver chain noise, using known gain and system noise figure.

FIG. 2 plots SNR along the axis of the cylinder versus field strength for a body-lining (20 cm radius) and a bore-lining (30 cm radius) configuration, both in the ultimate limit and for a 128-element array (with the designs illustrated in FIGS. 1A and 1B). Note that the field dependence of Curie magnetization, which was excluded in order to focus on intrinsic electrodyamic behavior in (Schnell W, Renz W, Vester M, Ermert H. Ultimate Signal-to-Noise Ratio of Surface and Body Antennas for Magnetic Resonance Imaging. IEEE Transactions on Antennas and Propagation 2000; 48(3): 418-428), has been included here for completeness. A number of observations may be made from these results.

First, SNR shows only a mild dependence on array radius, and this dependence diminishes as field strength diminishes. For the ultimate intrinsic case, the body-lining array has slightly higher SNR than the bore-lining array at field strengths up to 9.4T. Remarkably, for the 128-element array, the reverse is true: the SNR of the bore-liner slightly exceeds that of the body-liner at high fields. The general explanation of this behavior is that, while signal decreases with increasing distance between body and coil, body-derived noise received by the coil also decreases. The specific advantage of large radii is observed to be a high-field phenomenon, with the body-liner regaining the higher SNR at low field strength.

(This is in part because body-derived noise sources dominate coil-derived noise sources at high field strength, and in part because of the shaping of electromagnetic fields by body electrical properties at high operating frequency.) That said, the SNR of bore-liner and body-liner are nearly indistinguishable at field strengths of 1.5T to 3T.

Second, at 3T and below, the SNR of encircling 128-element arrays closely approaches the ultimate intrinsic SNR. The increasing discrepancy at higher field strengths results from the reduced RF wavelength and the correspondingly increased complexity of electromagnetic field patterns and optimal current patterns, which would require larger numbers of array elements to approximate.

Figure 3:
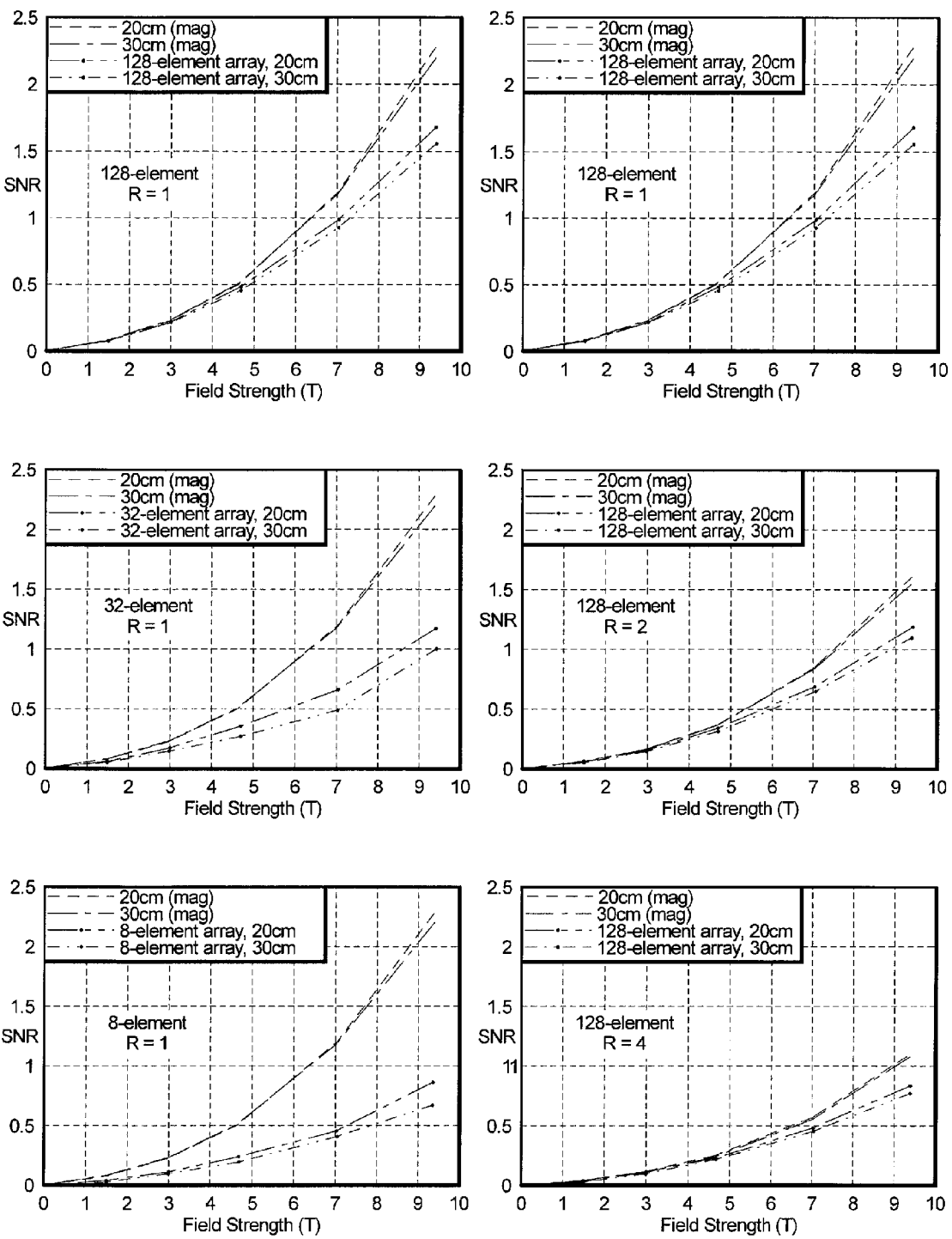
FIG. 3 contains graphs showing the intrinsic and finite encircling array SNR compared to field strength for various numbers of array elements.

FIG. 3 shows corresponding results for encircling 32- and 8-element arrays, as well as for 128-element arrays at various parallel imaging acceleration factors. Whereas the 128-element array is comprised of 16 circumferential elements by 8 axial elements, the 32- and 8-element arrays have the same basic configuration shown in FIG. 1 but with 8 by 4 or 4 by 2 elements, respectively. The left column of FIG. 3 demonstrates that a large number of elements is in fact required to approach the ultimate SNR limit, but that the general behavior with coil radius observed with 128-element arrays is preserved for smaller numbers of elements. The right column of FIG. 3 verifies that, contrary to general expectations, SNR remains similar for body-lining and bore-lining cases even in the presence of accelerated parallel imaging.

Figure 2:
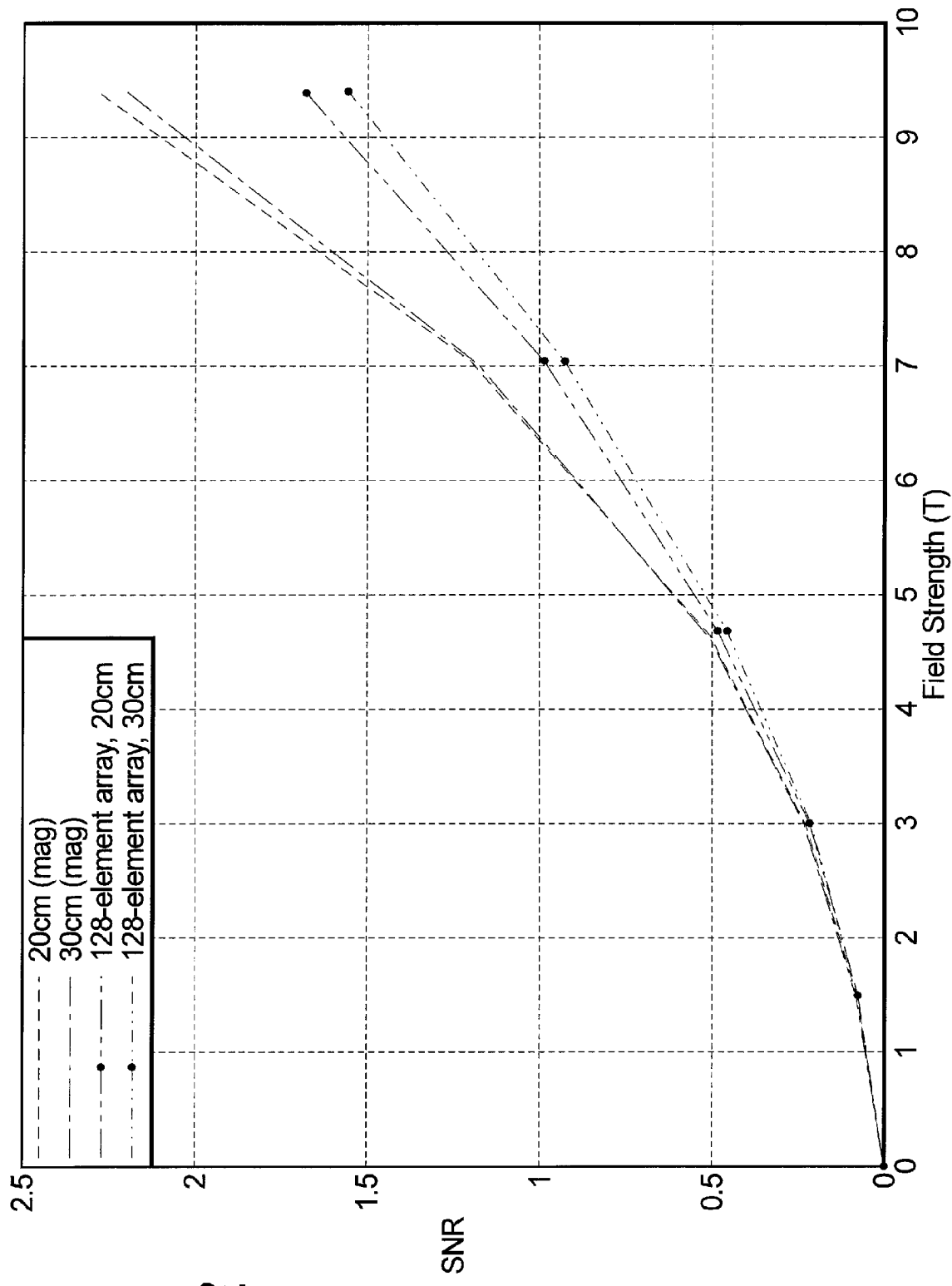
FIG. 2 is a graph showing the ultimate intrinsic (i.e. best possible) signal to noise ratio for cylinders respectively of 20 cm and 30 cm radius, and for the finite coil arrays of those diameters respectively shown in FIGS. 1A and 1B.
Figure 4:
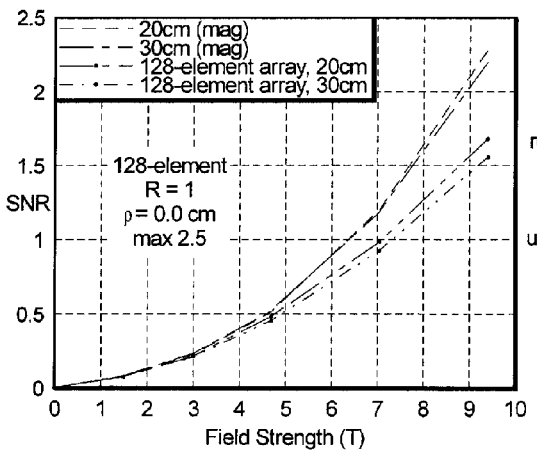
FIG. 4 contains graphs showing the intrinsic and 128-element encircling array SNR versus field strength for three points of interest along the cylinder axis.
Figure 4:
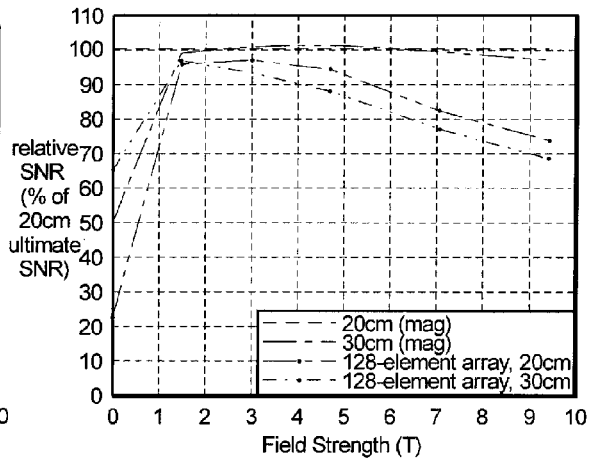
Figure 4:
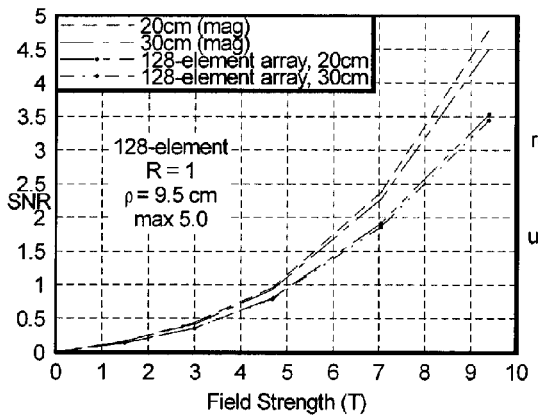
Figure 4:
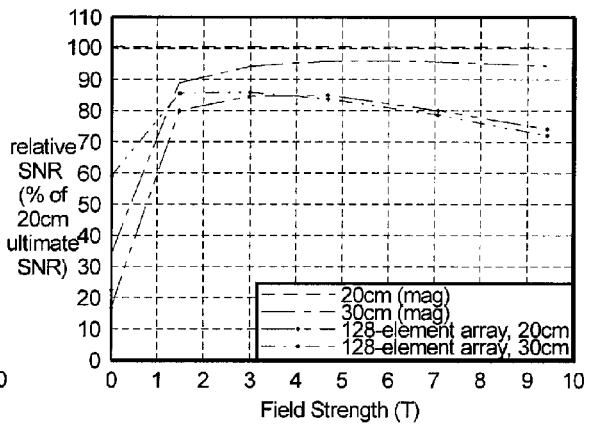
Figure 4:
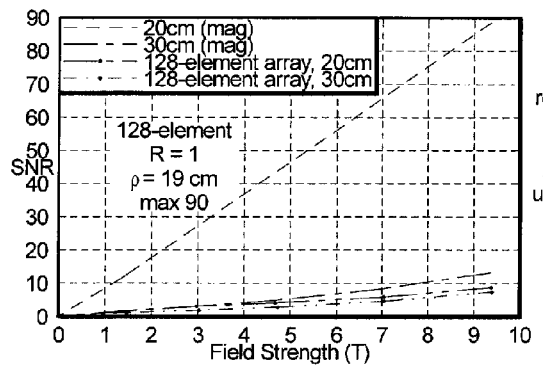
Figure 4:
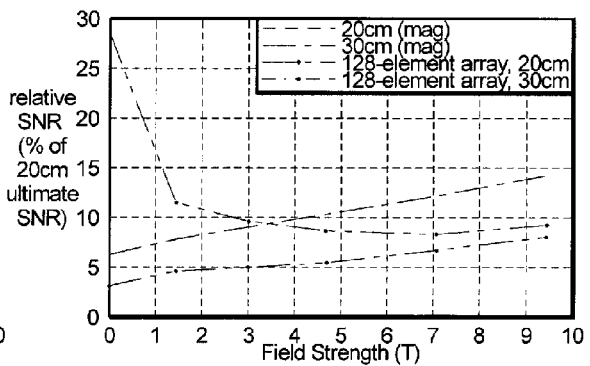

The SNR values in FIGS. 2 and 3 are for a deep-lying region along the central axis of the cylinder, i.e. for $\rho=0$ and $z=0$. FIG. 4 shows what happens as the point of interest is moved out from the center towards the edge of the cylinder. In the left column of FIG. 4, SNR is plotted versus field strength as in previous figures. In the right column, SNR is shown as a percentage of the ultimate value at 20 cm radius (i.e. each curve has been divided point-by-point by the curve representing the body-lining ultimate intrinsic SNR). The top row repeats the results for $\rho=0$. The middle row shows results for $\rho=9.5$ cm, i.e. half-way between the center and the edge of the cylinder. The near-equivalence of SNR for bore-lining and body-lining arrays continues to apply. Only for a point ($\rho=19$ cm, bottom row) very close to the cylinder surface does this behavior break down, with the SNR for a bore-lining 128-element array dropping to approximately 50% of its body-lining counterpart. Meanwhile, the ultimate intrinsic SNR at the larger bore-lining radius, though greater than the SNR for both 128-element arrays, is reduced by an order of magnitude compared with the body lining ultimate SNR (see the relative SNR plot at the bottom right of FIG. 4), indicating that more than 128 body-contoured small elements would be required to approach the ultimate SNR value for superficial regions such as this. Taken together, the results in FIG. 4 suggest that a bore-lining array would preserve SNR over a substantial fraction of the interior volume of the body, and would therefore be advantageous in workflow and simplicity for a majority of routine clinical imaging examinations. For truly superficial regions such as the skin or outer cortical layers of the brain, close-fitting many-element coil arrays would be expected to yield improved SNR, and such arrays could be used on an occasional as-needed basis.

Figure 5:
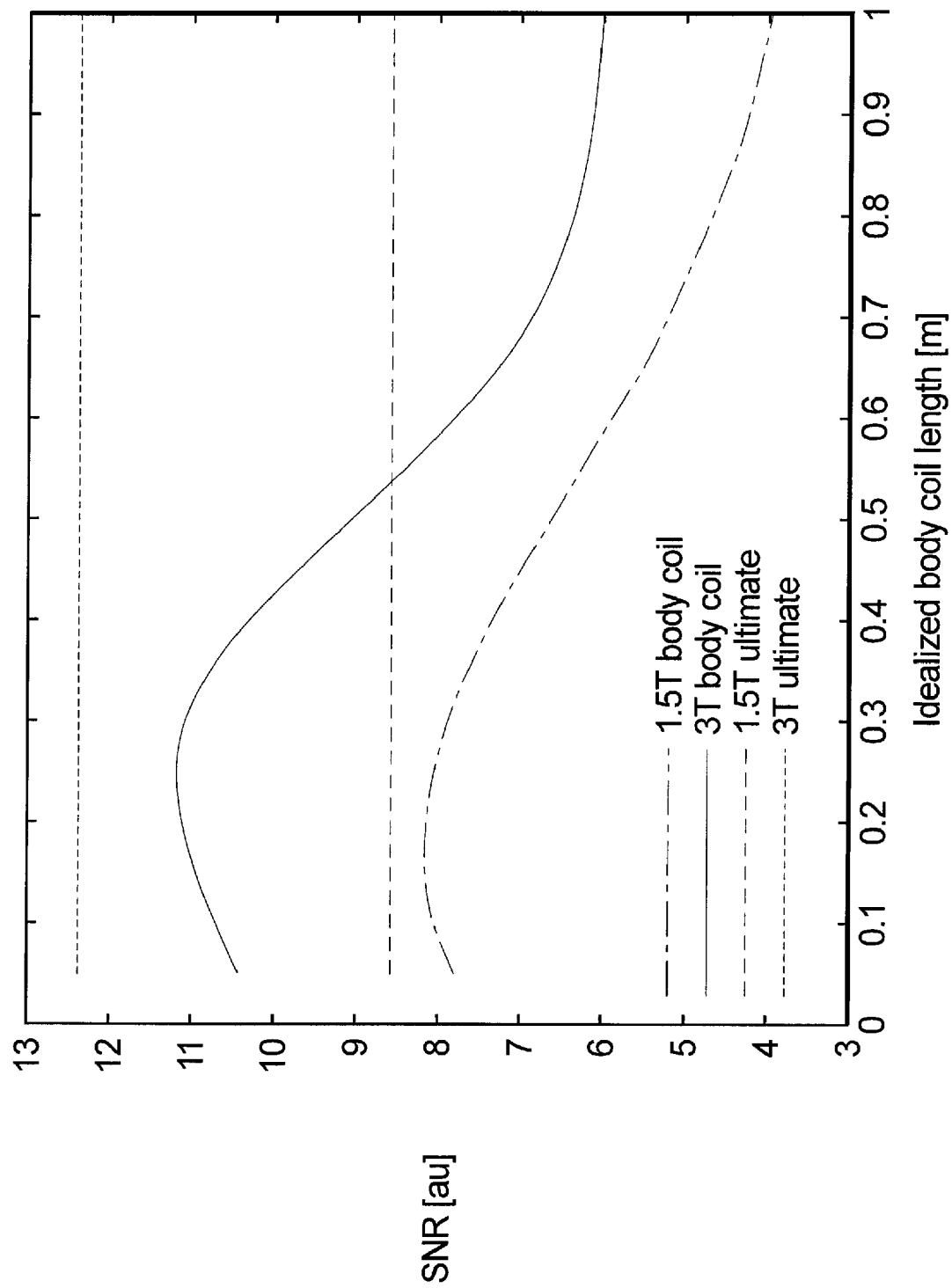
FIG. 5 illustrates the signal-to-noise ratio (SNR) of an idealized birdcage body coil at 1.5 T and 3T as a function of the body coil axial length, wherein dashed lines indicate the ultimate intrinsic SNR at each field strength for comparison.

The prospect of using remote body arrays for routine clinical examinations raises the question of how the SNR of such arrays would compare with the SNR of conventional birdcage body coils. FIG. 5 compares the SNR of an idealized bore-lining birdcage coil (modeled as a pure sinusoidal current distribution around the circumference, simply truncated to a defined length along z) with the ultimate intrinsic SNR at 1.5T and at 3T. Data are shown as a function of birdcage length, and coil SNR is seen to rise to a maximum at a comparatively small length—between 20 and 30 cm—centered around the axial point of interest. This maximum SNR does approach the ultimate intrinsic SNR, more closely at 1.5T than at 3T, though as shown in previous figures SNR for 128-element arrays is higher, nearly saturating the ultimate SNR at these field strengths. Moreover, focusing along z is required to approach the ultimate case, which would require a short birdcage appropriate only for a small range of axial positions. By contrast, use of a many-element array allows automatic focusing for any z position. Importantly, array use also enables parallel imaging, which is clearly not possible with a birdcage coil alone.

Of course, another principal purpose of a birdcage body coil is RF transmission. As will be discussed further below, either a single transmit body coil could be used in conjunction with remote body arrays (with attendant practical issues of transmit-receive decoupling and interactions), or else the elements of the remote array could themselves be configured for transmission as well as reception, allowing not only close emulation of birdcage or TEM transmit patterns, but also careful tailoring of transmission patterns through hardware combinations, RF shimming, or fully parallel transmission (Katscher U, Bornert P, Leussler C, van den Brink JS. Transmit SENSE. Magn Reson Med 2003; 49(1): 144-50; Zhu Y. Parallel excitation with an array of transmit coils. Magn Reson Med 2004; 51(4): 775-84; Setsompop K, Wald L L, Alagappan V, Gagoski B, Hebrank F, Fontius U, Schmitt F, Adalsteinsson E. Parallel RF transmission with eight channels at 3 Tesla. Magn Reson Med 2006; 56(5): 1163-71).

Figure 6:
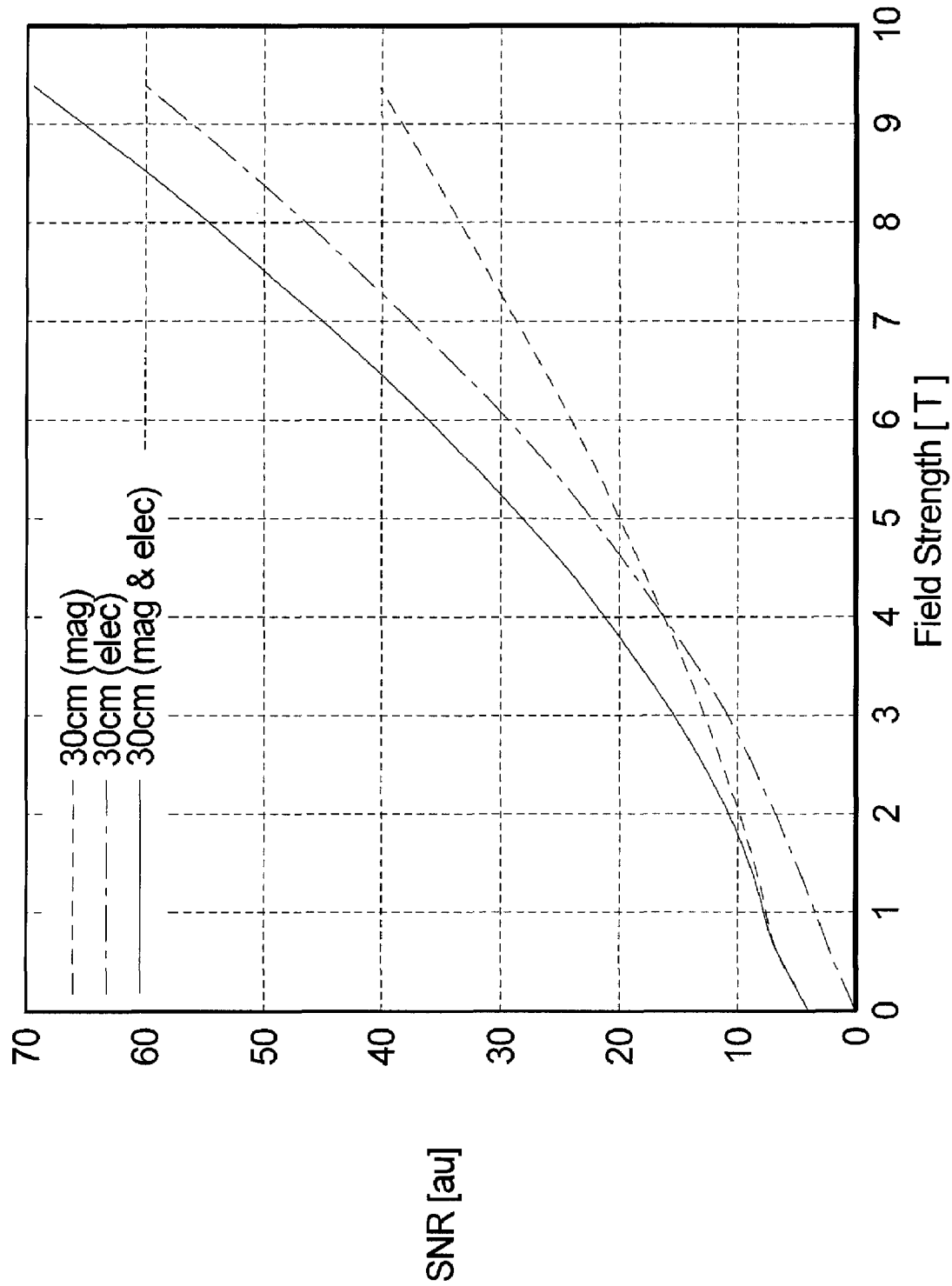
FIG. 6 illustrates the ultimate intrinsic SNR for a central point of interest as a function of field strength, with respective current contributions, namely magnetic dipole current contributions only, electric dipole current contributions only, and both magnetic and electric dipole current contributions.

All of the results discussed so far have used a limited current basis set of magnetic dipoles (i.e. closed current loops). However, electric dipole contributions (i.e. non-closed strip elements, also realizable with magnetic dipole elements rotated out of plane) are required to generate truly arbitrary current distributions on the cylinder. FIG. 6 illustrates the impact on ultimate SNR of choosing different current basis elements on a bore-lining 30 cm-radius outer cylindrical surface. The ultimate intrinsic axial SNR computed with magnetic dipole contributions only is plotted in blue; the value computed with electric dipole contributions alone is plotted in red; and the value computed with both electric and magnetic dipole basis elements is shown in green. The optimum computed with a full combined basis set is of course always highest (and may be shown to be rigorously radius-independent in the absence of conductor losses and other circuit-derived noise). The field dependence of these curves is noteworthy; at low field, the ultimate SNR is clearly dominated by magnetic dipole contributions. However, beyond 2T the gap between magnetic dipole and full SNR grows, and at field strengths higher than 4T the ultimate SNR achievable with electric dipole components only is higher than that which may be achieved with magnetic dipoles.

FIG. 7 shows current patterns on the 30 cm-radius outer cylindrical surface required to achieve the ultimate instrinsic SNR at a point ($\rho=0$, $z=0$) along the axis of the cylinder. The quiver plots in the figure depict an unrolled cylindrical surface, with z position along the abscissa and angle from $\emptyset=-180°$ to $\emptyset=+180°$ along the ordinate. Relative magnitude of the current density is indicated by the arrow length at each point, and arrow direction indicates the net current vector direction. These current patterns were calculated by applying the weights derived in the course of the ultimate intrinsic SNR calculation to the current basis set used. They apply for the point of interest only—for example, shifting the point along z would result in a corresponding shift of the ultimate current pattern. In FIG. 7, the behavior of the optimal current distribution as a function of field strength and current basis composition is shown. As a result of the symmetry of the cylinder axis, all current patterns shown share a one-cycle sinusoidal modulation in 0. At low field (0.02T), the ultimate magnetic dipole current distribution resembles a pair of distributed loops centered on the point of interest. The ultimate electric dipole pattern resembles a pair of distributed linear elements. The full current distribution is dominated by the magnetic dipole contribution. As field strength increases to 3T and 7T, the combined pattern is increasingly influenced by the electric dipole contribution, and both electric and magnetic dipole patterns diverge from simple symmetric geometries. This geometric complexity accounts in part for the increasing gap even between ultimate magnetic-dipole SNR and expected SNR for finite cylindrical window arrays observed with increasing field strength in FIGS. 2-4. At high field strength, large numbers of small elements are required to approximate the complex optimal current patterns. These results suggest that incorporation of electric dipole elements and/or asymmetrically-shaped loop elements into remote body array designs may be beneficial at high magnetic field strength.

One limitation of the simulations described herein is that an infinite dielectric cylinder with uniform electrical properties is not a perfectly realistic body model. However, general trends observed in the simulations are expected to be preserved with more complex body structures. Coil and receiver chain noise have been incorporated into the simulations. Any coil noise not anticipated in our noise models could selectively diminish the SNR benefits of large-radius arrays, since once any elements at a distance from the body become dominated by coil-derived rather than body-derived losses, any further reductions in signal due to increased body-coil distance would not be balanced by corresponding reductions in noise. It will therefore be important to control coil- and circuit-derived noise sources in practical remote body arrays. Various techniques for coil-noise reduction will be described to follow. Noise coupling between array elements has also been included in the noise model for the simulations, but inductive coupling and some other electrical interactions have not been explicitly included. These interactions have the potential to degrade body array performance as well, and careful electrical design is required. Nevertheless, there is evidence that some moderate degree of coupling may be compensated in software without incurring any SNR penalty (Ohliger M A, Ledden P, McKenzie C A, Sodickson D K. Effects of inductive coupling on parallel MR image reconstructions. Magn Reson Med 2004; 52(3): 628-39). Such software compensations can be incorporated in a straightforward way with practical remote body array designs. In the meantime, the 10% overlap between adjacent array elements in FIG. 1 was chosen to approximate geometrical decoupling arrangements typically used in RF coil arrays, and preamplifier decoupling was further assumed, with approximate preamplifier-derived noise levels included in the noise model.

Figure 1B:
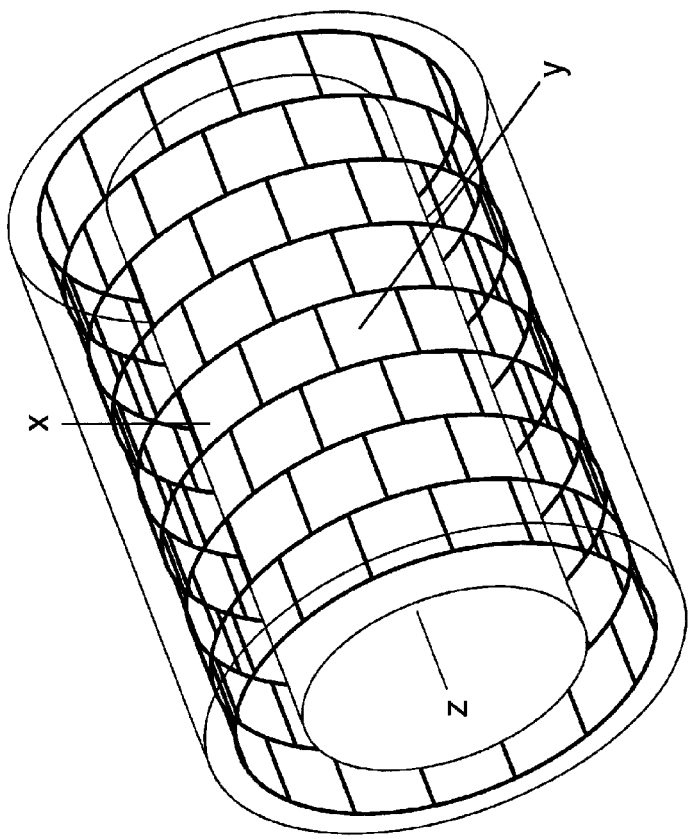
FIG. 1B schematically illustrates an embodiment of a body coil array in accordance with the present invention, with the array having a radius of 30 cm (bore liner).
Figure 1A:
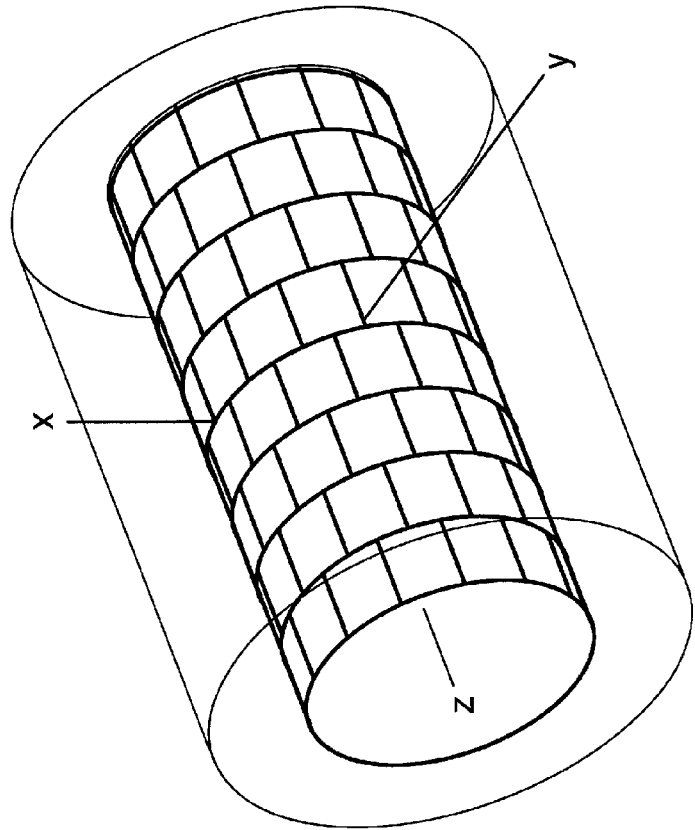
FIG. 1A schematically illustrates an embodiment of a body array for comparison with the present invention, with the array having a 20 cm radius (body liner).

Embodiments of the present invention can have elements lining or incorporated into the magnet bore. As shown in FIG. 1B the elements in respective encircling rings can be overlapped so as to minimize coupling, and staggered so that the corners of the individual array elements are not aligned.

In addition to elements incorporated in the bore, elements of the array can be incorporated into the patient table.

Elements can be used in the array that are operated both in a transmit mode and in a reception mode. Operation of the array elements in a transmit mode eliminates the need for a conventional body coil. It is possible for all of the elements to be selectively operated either as reception elements or transmission elements, or a switching matrix can be employed so that there are fewer effective transmission elements than reception elements. This conserves hardware for power distribution to the individual elements.

Individual coils constructed of metal conductor can be covered with a thin sheet of superconductor to improve Q and to reduce noise originating from the coils.

The RF shield also can be covered with a superconducting film.

Liquid nitrogen or a cold gas stream can be used for cooling, and appropriate thermal isolation can be provided.

The remote array can be incorporated into the cryostat for the main superconducting magnet in order to reduce coil noise.

The reception and transmission functions outside of the cryostat can be coupled by a non-galvanic coupling element, such as by inductive coupling or capacitive coupling. Highly resonant, superconducting coils can be over-coupled in order to improve bandwidth.

Although other modifications and changes may be suggested, it is the intention of the inventors to embody within the patent warranted hereon all changes and modifications as reasonably and properly come within the scope of their contribution to the art.

We claim as our invention:

1. A magnetic resonance imaging apparatus comprising:
    a magnetic resonant scanner comprising a scanner housing having a cylindrical bore therein configured to receive an examination subject to acquire magnetic resonance data from the examination subject, said scanner housing having an interior wall defining said bore and an exterior wall of the scanner that is radially spaced from said inner wall;
    a basic field magnet located in a cryostat between said inner wall and said exterior wall; and
    a plurality of radio frequency coils in an array that completely encircles said examination subject in said bore, said array being located in said cryostats.

2. A magnetic resonance apparatus as claimed in claim 1 wherein said array is located substantially concentrically with said inner wall.

3. A magnetic resonance apparatus as claimed in claim 1 wherein said array is located between said inner wall and said exterior wall.

4. A magnetic resonance apparatus as claimed in claim 1 wherein said bore has a central, longitudinal axis, and wherein said array has a radius of 30 cm relative to said axis.

5. A magnetic resonance imaging apparatus as claimed in claim 1 comprising a control unit that operates individual coils in said array in both a transmit mode and a reception mode at non-coinciding times.

6. A magnetic resonance apparatus as claimed in claim 1 wherein said coils have respective magnetic dipole current paths that conform to current paths for optimizing a signal-to-noise ratio of signals in the said coils.

7. A magnetic resonance apparatus as claimed in claim 1 wherein said bore has a central, longitudinal axis, and wherein said coils are arranged in said array in a plurality of rings respectively proceeding around, and successively along, said longitudinal axis.

8. A magnetic resonance imaging apparatus as claimed in claim 7 wherein said rings are circumferentially offset from each other so that respective coils in adjacent rings are not aligned with each other along said longitudinal axis.

9. A method for acquiring magnetic resonance data comprising the steps of:
    inserting a subject in a cylindrical bore of a magnetic resonant scanner and acquiring magnetic resonance data from the examination subject in the bore, said scanner housing having an interior wall defining said bore and an exterior wall of the scanner that is radially spaced from said inner wall;

completely encircling the examination subject in the bore with an array of RF coils located between said inner wall and said exterior wall; and during acquisition of said magnetic resonance data, operating at least some of the individual RF coils in the array to cause a same individual coil, at non-coinciding times, to both irradiate the subject with RF pulses and to receive magnetic resonance signals from the subject.

10. A method as claimed in claim 9 comprising locating said array is located substantially concentrically with said inner wall.

11. A method as claimed in claim 9 comprising locating said array between said inner wall and said exterior wall.

12. A method as claimed in claim 9 wherein said bore has a central, longitudinal axis, and comprising providing said array with a radius of 30 cm relative to said axis.

13. A method as claimed in claim 9 comprising providing a basic field magnet in a cryostat in said scanner between said inner wall and said outer wall, and locating said array in said cryostat.

14. A method as claimed in claim 10 comprising configuring said coils to have respective magnetic dipole current paths that conform to current paths for optimizing a signal-to-noise ratio of signals in the said coils.

15. A method as claimed in claim 9 wherein said bore has a central, longitudinal axis, and comprising arranging said coils in an array in a plurality of rings respectively proceeding around, and successively along, said longitudinal axis.

16. A method as claimed in claim 15 comprising circumferentially offsetting said rings from each other so that respective coils in adjacent rings are not aligned with each other along said longitudinal axis.

17. A magnetic resonance imaging apparatus comprising:
a magnetic resonant scanner comprising a scanner housing having a cylindrical bore therein configured to receive an examination subject to acquire magnetic resonance data from the examination subject, said scanner housing having an interior wall defining said bore and an exterior wall of the scanner that is radially spaced from said inner wall;
a plurality of radio frequency coils in an array that completely encircles said examination subject in said bore, said coils in said array being spaced from, and out of contact with, the examination subject in said bore; and
said coils having respective current paths that include current elements other than magnetic dipole current elements.

18. A method for acquiring magnetic resonance data comprising the steps of:
inserting a subject in a cylindrical bore of a magnetic resonant scanner and acquiring magnetic resonance data from the examination subject in the bore, said scanner housing having an interior wall defining said bore and an exterior wall of the scanner that is radially spaced from said inner wall;
during acquisition of said magnetic resonance data, irradiating the subject with RF pulses emitted by, or receiving magnetic resonance signals from the subject with, a plurality of radio frequency coils in an array that completely encircles said examination subject in said bore, and orienting said coils in said array to be spaced from, and out of contact with, the examination subject in said bore; and
configuring said coils to have respective current paths that include current elements other than magnetic dipole current elements.

19. A magnetic resonance imaging apparatus as claimed in claim 17 wherein said coils have respective current paths that conform to current paths that conform to current paths for optimizing a signal-to-noise ratio of signals in said coils.

20. A method as claimed in claim 18 comprising configuring said coils to conform said respective current paths to current paths that optimize a signal-to-noise ratio of signals in said coils.

21. A magnetic resonance imaging apparatus comprising:
a magnetic resonant scanner comprising a scanner housing having a cylindrical bore therein configured to receive an examination subject to acquire magnetic resonance data from the examination subject, said scanner housing having an interior wall defining said bore and an exterior wall of the scanner that is radially spaced from said inner wall;
a plurality of radio frequency coils in an array that completely encircles said examination subject in said bore, said coils in said array being spaced from, and out of contact with, the examination subject in said bore; and
a control unit that operates at least some of the individual coils in said array to cause a same individual coil to operate in both a transmit mode and a reception mode at non-coinciding times.

* * * * *